(12) United States Patent
Delamare et al.

(10) Patent No.: US 9,647,578 B2
(45) Date of Patent: May 9, 2017

(54) ENERGY HARVESTER

(71) Applicants: Commissariat à l'énergie atomique et aux énergies alternatives, Paris (FR); Institut Polytechnique de Grenoble, Grenoble (FR); Centre National de la Recherche Scientifique, Paris (FR)

(72) Inventors: Jérome Delamare, Grenoble (FR); Bernard Viala, Sassenage (FR); Orphée Cugat, Poisat (FR); Thibault Ricart, Seyssinet-Pariset (FR)

(73) Assignees: COMMISSARIAT À L'ÉNERGIE ATOMIQUE ET AUX ÉNERGIES ALTERNATIVES, Paris (FR); INSTITUT POLYTECHNIQUE DE GRENOBLE, Grenoble (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 198 days.

(21) Appl. No.: 14/438,426

(22) PCT Filed: Oct. 15, 2013

(86) PCT No.: PCT/EP2013/071509
§ 371 (c)(1),
(2) Date: Apr. 24, 2015

(87) PCT Pub. No.: WO2014/063958
PCT Pub. Date: May 1, 2014

(65) Prior Publication Data
US 2015/0287562 A1    Oct. 8, 2015

(30) Foreign Application Priority Data
Oct. 22, 2012    (FR) ..................... 12 60047

(51) Int. Cl.
*H02N 2/18*    (2006.01)
*H01H 59/00*   (2006.01)
(Continued)

(52) U.S. Cl.
CPC ............ *H02N 2/181* (2013.01); *H01H 59/00* (2013.01); *H01L 41/00* (2013.01);
(Continued)

(58) Field of Classification Search
None
See application file for complete search history.

(56) References Cited

U.S. PATENT DOCUMENTS 4,480,156 A * 10/1984 Takahashi .............. H04B 3/237
379/406.06
6,522,048 B1  2/2003 Burns et al.
(Continued)

FOREIGN PATENT DOCUMENTS

EP    1093142    4/2001
EP    1426995    6/2004
(Continued)

OTHER PUBLICATIONS

S. Boisseau, G. Despesse and A. Sylvestre, "Optimization of an electret-based energy harvester", Smart Material and Structures, 2010, 19 075015, IOP Publisching Ltd.
(Continued)

*Primary Examiner* — Jared Fureman
*Assistant Examiner* — Swarna N Chowdhuri
(74) *Attorney, Agent, or Firm* — Occhiuti & Rohlicek LLP

(57) ABSTRACT

An energy harvester having a converter suitable for converting a variation of the energy to be harvested into a corresponding excess of electrical charges. There is a circuit for collecting the excess of electrical charges, the circuit is
(Continued)

equipped with a controllable switch and a control device for the switch designed to control the switching of this switch to its closed position. The control device is suitable for exerting a force which stresses the electrical contacts towards one another. The force varies continually as a function of the quantity of electrical charges present on the first terminal and bringing the electrical contacts to bear on one another only when the excess of electrical charges exceeds a predetermined threshold, and/or for ionizing the electrically insulating medium to produce an electrical arc between the two electrical contacts only when the excess of electrical charges exceeds the predetermined threshold.

9 Claims, 2 Drawing Sheets

(51) Int. Cl.
*H02N 10/00* (2006.01)
*H01L 41/00* (2013.01)
*H01L 41/113* (2006.01)

(52) U.S. Cl.
CPC .......... *H01L 41/1134* (2013.01); *H02N 2/18* (2013.01); *H02N 2/186* (2013.01); *H02N 10/00* (2013.01); *H01L 41/1136* (2013.01); *Y10T 307/826* (2015.04)

(56) References Cited

U.S. PATENT DOCUMENTS

| 7,397,169 | B2 | 7/2008 | Nersessian et al. |
| 2002/0050882 | A1 | 5/2002 | Hyman et al. |
| 2004/0126620 | A1 | 7/2004 | Viehland et al. |
| 2011/0083714 | A1 | 4/2011 | Descure |

FOREIGN PATENT DOCUMENTS

| WO | 2004051687 | 6/2004 |
| WO | 2007063194 | 6/2007 |
| WO | 2012001554 | 1/2012 |

OTHER PUBLICATIONS

Lafont et al., "Magnetostrictive-piezoelectric composite structures for energy harvesting," Journal of micromechanics and microengineering, No. 22 (2012).

Zakharov et al.: "Thermal energy conversion by coupled shape memory and piezoelectric effects", Journal of Micromechanics & Microengineering, vol. 22, No. 9 (2012).

* cited by examiner

ENERGY HARVESTER

RELATED APPLICATIONS

This application is a U.S. National Stage of international application number PCT/EP2013/071509 filed Oct. 15, 2013, which claims the benefit of the priority date of French Patent Application FR 1260047, filed Oct. 22, 2012, the contents of which are herein incorporated by reference.

FIELD OF INVENTION

The invention relates to an energy harvester for the implementation of an electricity generator.

BACKGROUND

Self-powered systems such as, for example, arrays of wireless standalone sensors require an in-situ electricity generator. These systems are often complex and comprise numerous elements which are often installed out of reach. In these situations, maintenance of the system is complicated and costly if, for example, a discharged battery replacement were to become necessary. It is therefore desirable not to replace the battery throughout the lifetime of the system in order to reduce the maintenance costs and eliminate the associated waste products.

It is in this context that electricity generators equipped with energy harvesters have been proposed. Energy harvesting is based on the use of energy sources freely available in the environment such as light, temperature changes, vibrations or similar, to generate electricity. For this conversion, an energy converter is used.

At the output of the energy converter, it is desirable to harvest the energy at a high useful voltage to be easily formatted by a load powered by this electric generator without too much energy wastage.

Thus, it has been proposed, in the application WO 2007/063194, to use a collection circuit and a control device for this collection circuit which make it possible to transfer the energy generated by the converter to the load to be powered only when this energy has reached a sufficient threshold.

Thus, known electricity generators comprise:
a source of energy to be harvested,
an energy harvester, this harvester comprising:
a converter equipped with first and second connection terminals, this converter being suitable for converting a variation of the energy to be harvested into a corresponding excess of electrical charges on the first connection terminal relative to the second terminal,
a collection circuit for collecting the excess of electrical charges on the first connection terminal, this circuit being equipped:
with an output terminal via which the collected charges are delivered, and
with a controllable switch connected to the first connection terminal, this switch being suitable for switching between an open position in which it prevents the discharging of the electrical charges through the first connection terminal and a closed position in which it allows the discharging of the electrical charges through the first connection terminal, and
a control device for the switch designed to control the switching of this switch to its closed position when the excess of electrical charges present on the first connection terminal exceeds a predetermined threshold.

As described in the application WO 2007/063194, the solid state switches of the collection circuit are typically transistors or thyristors. It is known practice to power these switches from electrical charges produced by the first converter so as to allow a standalone operation of the energy harvester, that is to say by using only the energy to be harvested.

Prior art is also known from U.S. Pat. No. 6,522,048 B1, EP 1 426 995 A1 and from the paper by Dimitry Zakharov et al: "Thermal energy conversion by coupled shape memory and piezoelectric effects", Journal of Micromechanics & Microengineering, volume 22, No. 9, 24 Aug. 2012, page 99005.

SUMMARY OF INVENTION

The invention aims to improve the efficiency of such an energy harvester. The efficiency is defined here as being the ratio between the quantity of energy actually transmitted to the load to be powered over the quantity of energy produced by the first converter.

Its subject is therefore an energy harvester according to claim 1.

The applicant has discovered that when the quantity of energy that can be harvested is small and the time taken to harvest it is long, the lowering of the efficiency was partly due to the use of solid state switches in the collection circuit. In effect, the transistors and thyristors or similar consume electricity when they switch between their closed and open positions. The electricity consumed by the switches of the collection circuit is not therefore transmitted to the load to be powered by the electricity generator. Furthermore, even in the open position, there is always a leakage current in the transistors and thyristors. This leakage current enables the first converter to discharge outside of the planned switching instants. This problem of discharging of the first converter by leakage currents is all the greater when the variations of the energy to be harvested are slow and therefore the switching frequency of the switches is low. Thus, the presence of transistors or thyristors in the known energy harvesters reduces their efficiency.

In the above generator, the controllable switch is a switch in which the open position is obtained by the mechanical separation of two electrical contacts and the interposition between these two electrical contacts of an electrically insulating medium. This switch is not a solid state switch such as a transistor or a thyristor as in the known collection circuits. With this switch there is no leakage current. The collection circuit can therefore be used to harvest charges at a high useful voltage even if the variations of the energy to be harvested are very slow.

Furthermore, exerting a force, that is a function of the quantity of electrical charges, which stresses the electrical contacts of the switch towards one another and/or ionizing the electrically insulating medium to close the switch as a function of the quantity of electrical charges present on the first terminal makes it possible to set, by mechanical characteristics, the value of the predetermined threshold beyond which the switch switches to its closed position. It is not therefore necessary to use a memory for that. This simplifies the control device and limits its electrical consumption which makes it possible to increase the efficiency of the energy harvester.

The embodiments of this energy harvester can comprise one or more of the features of the dependent claims.

These embodiments of the energy harvester further offer the following advantages:

the use of an electrostatic or piezoelectric transducer or of a spark gap to produce the control device limits its consumption and therefore makes it possible to increase the efficiency of the energy harvester and also makes it possible simply to mechanically set the predetermined threshold beyond which the switch must be closed;

using a spark gap as switch simplifies the control device since the latter is then incorporated within the very switch;

using a converter comprising a first electromechanical transducer and a second transducer suitable for exerting a stress on this first transducer makes it possible to generate electricity even from very slow variations of the energy to be harvested and to limit the bulk of the converter;

using a thermomechanical transducer as second transducer of the converter makes it possible to harvest electrical energy from a temperature variation and avoid having recourse to radiators to impose a temperature gradient;

using a material with shape memory makes it possible to exert greater stresses on the electromechanical transducer;

using a piezoelectric material as first transducer of the converter makes it possible to simply transform a stress variation into electricity.

The invention will be better understood on reading the following description, given merely by way of non-limiting example and with reference to the drawings.

DETAILED DESCRIPTION

In the figures, the same references are used to denote the same elements.

Hereinafter in this description, the features and functions that are well known to those skilled in the art are not described in detail.

Figure 1:
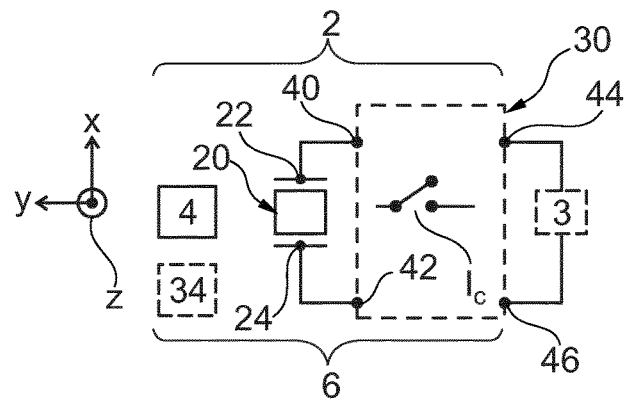
FIG. 1 is a general diagram of an electricity generator incorporating an energy harvester.

FIG. 1 represents an electricity generator 2 for powering an electrical load. In this particular case, the electrical load is a load capable of storing electrical energy. For example, it is a capacitor 3.

The generator 2 comprises a source 4 of energy to be harvested and a harvester 6 of this energy. The harvester 6 powers the capacitor 3 from the energy harvested.

The source 4 is a source of energy freely available in the environment of the harvester 6.

The harvester 6 comprises a converter 20, a collection circuit 30 and a control device 34 for the circuit 30.

The converter 20 converts a variation of the energy to be harvested into a corresponding excess of electrical charges on one connection terminal 22 or 24 relative to the other connection terminal 22 or 24.

The circuit 30 collects the excess of electrical charges on the terminal 22 or 24 and transfers the collected electrical charges to the capacitor 3. For this, it is equipped with one or more controllable mechanical switches Ic.

The device 34 controls the switches Ic in such a way as to transfer the excess of electrical charges generated by the converter 20 to the capacitor 3 only when this excess has reached a sufficient threshold. In this first example, the source 4 is a variable magnetic field source. The amplitude of the components $B_X$ and $B_Y$ of the variable magnetic field, respectively, parallel to directions X and Y, varies over time. Here, the directions X and Y are mutually orthogonal and horizontal. In this particular embodiment, the variations of the components $B_X$ and $B_Y$ are temporally phase-shifted relative to one another by a predetermined value. In this example, this phase shift is equal to 90° and the components $B_X$ and $B_Y$ are said to be in phase opposition.

For example, the source 4 comprises a permanent magnet, the magnetic moment of which is horizontal, and a motor rotationally driving the magnet about a vertical axis parallel to a direction Z. The direction Z is at right angles to the directions X and Y.

Here, the converter 20 generates an excess of electrical charges on the terminal 22 that is proportional to the absolute value of the amplitude of the component $B_X$. It also generates an excess of electrical charges on the terminal 24 that is proportional to the absolute value of the amplitude of the component $B_Y$. Since the amplitude of the components $B_X$ and $B_Y$ are in phase opposition, when the excess of electrical charges is maximum on the terminal 22, it is minimum on the terminal 24 and vice versa.

Preferably, the converter 20 is arranged in proximity to the source 4. For example, the shortest distance between the converter 20 and the source 4 is less than 10 cm and, preferably, less than 1 cm.

The converter 20 is also suitable for storing the electrical charges produced on the terminals 22 and 24 when these terminals are electrically insulated from any other external electrical circuit likely to enable it to be discharged. Thus, the converter 20 also operates as a capacitor. For example, in the absence of a connection to an external electrical circuit, the excess of charges present on the terminal 22 or 24 varies by less than 50% in more than 1 ms and, preferably, in more than 1 s or 1 min or 1 h.

The converter 20 is described in more detail with reference to FIG. 3.

The circuit 30 comprises two input terminals 40 and 42 directly connected, respectively, to the terminals 22 and 24. The circuit 30 also comprises two output terminals 44 and 46 directly connected, respectively, to terminals 49 and 50 of the capacitor 3.

Here, it is said that the elements A and B are "directly connected" when there is an electrical link connecting these elements A and B which does not pass through another electrical component such as another switch, another diode or an inductance. Furthermore, in this description, unless specifically stated otherwise, the term "connect" means "connect electrically".

Figure 2:
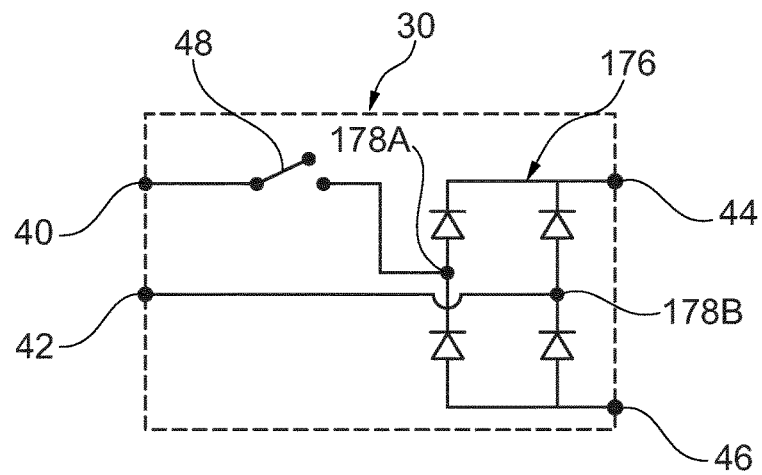
FIG. 2 is a schematic illustration of a collection circuit of the energy harvester of FIG. 1.

FIG. 2 represents an exemplary embodiment of the circuit 30 in more detail. The circuit 30 is designed to transfer the electrical charges accumulated on the terminals 22 and 24 to the output terminal 44. To this end, it comprises:

a mechanical switch 48 directly connected on one side to the terminal 40, and a diode bridge 176 capable of rectifying the current generated by the discharging of the converter 20.

The diode bridge 176 comprises first and second branches electrically connected in parallel between the terminals 44 and 46. The first branch comprises two diodes connected in series via a mid-point 178A. The second branch also comprises two diodes connected in series via a mid-point 178B.

The mid-point 178A is directly connected permanently to one of the electrical contacts of the switch 48. The mid-point 178B is permanently connected to the terminal 42 of the collection circuit, for example, via an inductance which is not represented in FIG. 2.

An embodiment of this switch 48 is described in more detail with reference to FIG. 4.

The device 34 controls the switching of the switches of the circuit 30 to switch, alternately, between:

a first discharging position in which the excess of electrical charges accumulated on the terminal 22 is transferred to the terminal 44, a second discharging position in which the excess of electrical charges accumulated on the terminal 24 is transferred to the terminal 44, and a rest position, represented in FIG. 2, in which the terminal 22 is electrically insulated from any other electrical circuit so as to allow the accumulation of the electrical charges between these terminals.

More specifically, the device 34 is designed to:

control the switchover to the first discharge position only when the excess of charges accumulated on the terminal 22 exceeds a predetermined threshold $S_1$, control the switchover to the second discharge position only when the excess of charges accumulated on the terminal 24 exceeds a second predetermined threshold $S_2$ here identical to the threshold $S_1$, and control the switchover to the rest position as long as the excess of electrical charges accumulated on the terminal 22 is below the threshold $S_1$ and on the terminal 24 is below the threshold $S_2$.

Figure 3:
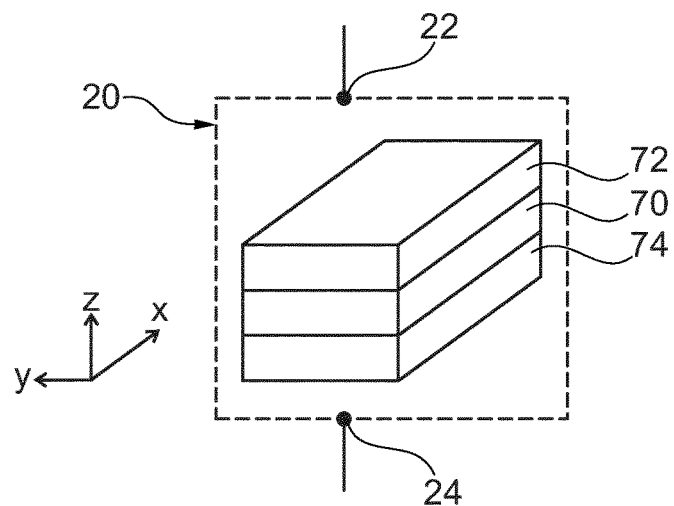
FIG. 3 is a schematic illustration of an energy converter used in the electricity generator of FIG. 1.

FIG. 3 represents the converter 20 in more detail. This converter 20 is capable of transforming very slow variations of the energy to be harvested into electricity. "Slow variation" describes variations with a fundamental frequency below 1 Hz or 100 Hz. To this end, the converter 20 converts a variation of the amplitude of the variable magnetic field in a given direction into a generation of an excess of charges on the terminal 22 and, alternately, on the terminal 24. This conversion is done almost instantaneously such that the voltage between the terminals 22 and 24 varies at the same time and as the amplitude of the variable magnetic field varies in a given direction.

In this embodiment, the converter 20 comprises a magnetic transducer associated with an electromechanical transducer. The magnetic transducer is a layer 70 made of magnetostrictive material. The electromechanical transducer here comprises a top layer 72 and a bottom layer 74 made of piezoelectric material. The layers 72, 74 are directly fixed with no degree of freedom, respectively, above and below the layer 70. Here, the layers 70, 72 and 74 extend along a longitudinal direction parallel to the direction X.

The layer 70 is produced in a magnetostrictive material, the absolute value of the magnetostriction coefficient $\lambda_s$ of which is greater than 10 ppm (parts per million) and preferably greater than 100 or 1000 ppm. The coefficient $\lambda_s$ is defined by the following relationship: $\lambda_s = \Delta L/L$, in which:

$\Delta L$ is the rate of elongation of the magnetostrictive material in a given direction, and L is the length of this material in this direction in the absence of external magnetic field.

Here, the coefficient $\lambda_s$ is positive. For example, the magnetostrictive material is Terfenol-D or FeSiB.

The piezoelectric layers are glued directly on either side of the layer 70. For example, the coefficient of coupling k of these piezoelectric layers is greater than 5% or 10%. This coefficient of coupling is defined in the standard ANSI/IEEE 176-1987 "ANSI/IEEE standard on piezoelectricity" or in the standards of the family EN50324. For example, the piezoelectric material used is PZT ($PbZt_xTi_{1-x}O_3$) or similar.

For more details on the converter 20, the reader can refer to the following article A1:

T. Lafont, J. Delamare, G. A. Lebedev, D. I. Zakharov, B. Viala, O. Cugat, L. Gimeno, N. Galopin, L. Garbuio and O. Geoffroy, "*Magnetostrictive-piezoelectric composite structures for energy harvesting*", Journal of micromechanics and microengineering, No. 22, 2012.

The layer 70 makes it possible to generate a stress of several tens of MPa on the piezoelectric layers 72 and 74 which generate, in response, a voltage of several tens of volts between the terminals 22 and 24. Typically, the maximum voltage generated between the terminals 22 and 24 exceeds 200 Vdc. It has been measured that the energy produced by such a converter can be greater than 50 µJ and, preferably, greater than 100 µJ in response to a quarter turn rotation of a magnet.

Figure 4:
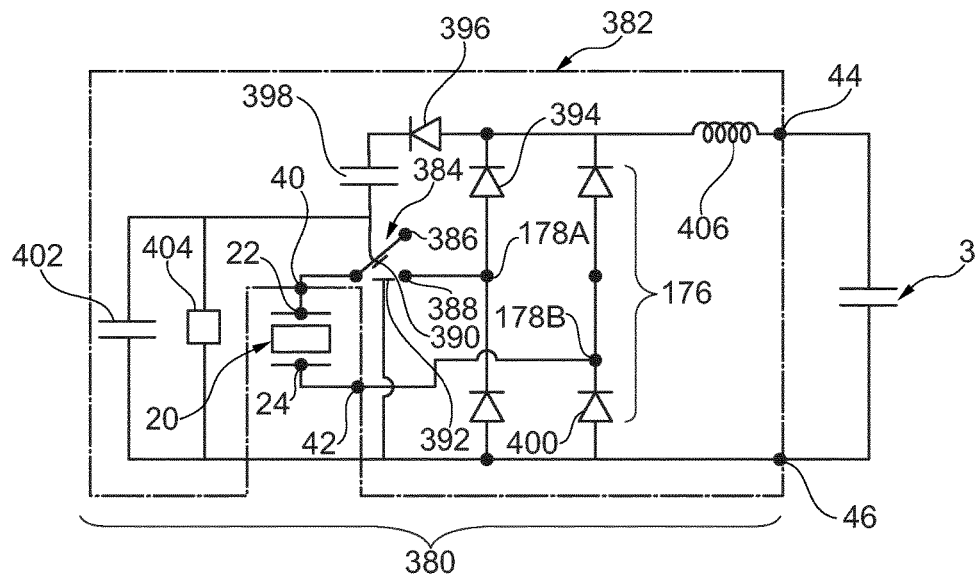
FIG. 4 is a more detailed schematic illustration of a first embodiment of a switch used in the circuit of FIG. 2.

FIG. 4 represents an energy harvester 380. This harvester comprises the converter 20 and a collection circuit 382. The collection circuit 382 is identical to the collection circuit 174 except that the switch 48 is replaced by an electrostatic relay 384. Such an electrostatic relay automatically displaces its electrical contacts from the open position to the closed position when the difference in potentials between its electrical contacts is above a predetermined switching threshold.

Here, the relay 384 comprises two electrical contacts 386 and 388 that can be displaced between the open position (represented in FIG. 4) and a closed position, in which these contacts are mechanically bearing on one another to establish an electrical continuity. In the open position, the two electrical contacts are mechanically separated and an electrically insulating medium is interposed between them.

The contacts 386 and 388 are permanently connected, respectively, to the terminal 22 and to the mid-point 178A of the diode bridge 176.

The relay 384 also comprises two electrodes 390 and 392 for controlling the closure of this relay. The electrodes 390 and 392 face one another. The potential of the electrode 390 is permanently equal to that of the terminal 22 by virtue of a diode 394 situated in the top part of the diode bridge 176, a diode 396 and a capacitor 398 for lowering the voltage.

The electrode 392 is permanently connected to the terminal 24 of the converter 20 via a diode 400 situated in the bottom part of the diode bridge 176.

The diode 396 makes it possible to retain the electrical charges which are accumulated on the electrode 390.

The capacitor 398 makes it possible to lower the value of the switching threshold of the relay 384 to a desired value. To this end, the capacitor 398 lowers the difference in potentials present between the terminals of the converter 20. Here, the switching threshold is chosen to correspond, to within plus or minus 30% or 5%, to the maximum difference in potentials generated between the terminals 22 and 24 by the converter 20.

The electrodes 390 and 392 face one another and form a capacitor. The capacitance of this capacitor and its leakage resistance determines the time necessary for the relay 384 to return to its open position after the difference in potentials between the contacts 386 and 388 has dropped back below the switching threshold of this relay.

To set this duration, it is possible to parallel-connect the electrodes 390 and 392 to another capacitor 402 and another additional leakage resistor 404. An inductance 406 is connected between the diode bridge 176 and the terminal 44. It notably makes it possible to limit the increase of the intensity of the current upon the closure of the relay 384. Conversely, upon the opening of the relay 384, this inductance increases the intensity of the current. However, this increase in the intensity of the current upon the opening of the relay 384 is limited by the diodes of the bridge 176 which then fulfil the function of freewheeling diodes.

Figures 5, 6:
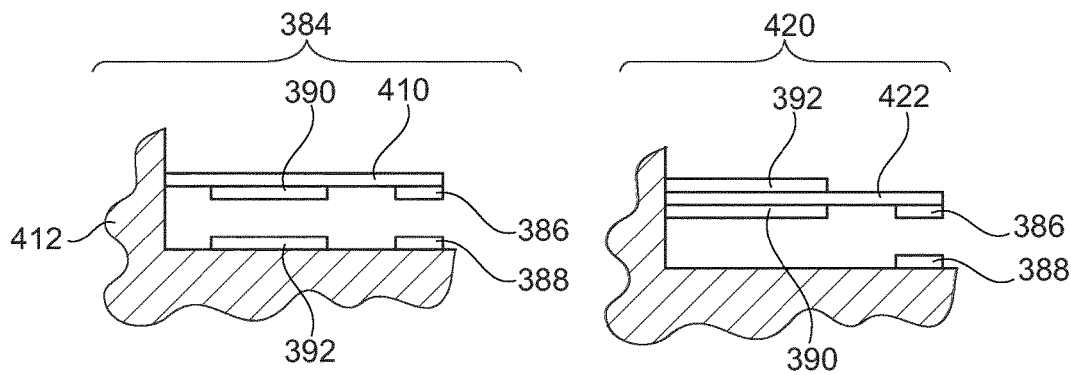
FIGS. 5 and 6 are schematic illustrations, respectively, of an electrostatic relay and of a piezoelectric relay.

FIG. 5 represents a possible embodiment of the relay 384 in more detail. This relay 384 comprises a suspended beam 410. On one side, this beam is anchored with no degree of freedom to a fixed frame 412. On the other side, the contact 386 is fixed with no degree of freedom onto the distal end of this beam 410.

The electrode 390 is fixed, with no degree of freedom, between the contact 386 and the anchoring point of this beam on the frame 412. The contact 388 and the electrode 390 are fixed, with no degree of freedom, onto the frame 412 facing, respectively, the contact 386 and the electrode 390.

Preferably, the distance between the electrodes 390 and 392 in the rest state is greater than 1 μm, so as to support the difference in potentials between these electrodes, greater than 250 Vdc, without provoking any electrical arc.

The difference in potentials between these electrodes 390 and 392 creates an electrostatic force which displaces the contact 386 towards the contact 388. If the difference in potentials is sufficient to overcome the return force of the beam 410, the contacts 386 and 388 then switch over from the open position to the closed position. When the difference in potentials between the electrodes 390 and 392 drops back below the switching threshold, the contacts 386, 388 return to the open position under the effect of the return force of the beam 410.

When the amplitude of the difference in potentials between the terminals 22 and 24 of the converter 20 increases, the quantity of charges accumulated between the electrodes 390 and 392 and in the capacitor 402 increases. If the difference in potentials continues to increase, the switching threshold of the relay 386 is crossed. In response, the relay 386 closes and the charges present on the terminal 22 are transferred to the terminal 44 via the contacts 386 and 388, the diode bridge 176 and the inductance 406. The difference in potentials between the terminals 22 and 24 then drops and drops back below the switching threshold. However, the charges accumulated in the capacitor formed by the electrodes 390 and 392 can be discharged only through the leakage resistance of this capacitor, notably because of the presence of the diode 396, whose cathode is directly connected to the electrode 390. Consequently, an electrostatic force sufficient to keep the contacts 386 and 388 in the closed position is maintained for some time, even after the difference in potentials between the terminals 22 and 24 has dropped back below the switching threshold. This allows the time necessary for almost all of the electrical charges present on the terminal 22 to be transferred to the terminal 44. Then, the relay 384 once again opens, which enables the charges produced by the converter 20 to begin to accumulate again between the terminals 22 and 24.

It will be noted that the relay 384 switches to its passing state as soon as the absolute value of the difference in potentials between the terminals 22 and 24 exceeds the switching threshold and does so without taking account of the sign of this difference in potentials.

In the energy harvester 380, the control device is an electrostatic transducer, formed by the electrodes 390 and 392, which converts the difference in potentials between the electrodes 22 and 24 into an electrostatic force which displaces the electrical contacts 386, 388 from the open position to the closed position.

FIG. 6 represents a piezoelectric relay 420 likely to be used instead of the relay 384. This relay 420 is identical to the relay 384 except that the beam 410 is replaced by a beam 422 made of piezoelectric material and the electrodes 390 and 392 are directly fixed on either side of this beam 422. Preferably, to support a significant difference in potentials, that is to say greater than 200 or 250 Vdc between the electrodes 390 and 392, the thickness of the beam 422 is greater than or equal to 2 or 4 or 5 μm.

The electrodes 390 and 392 are each connected to the converter 20 as described with reference to FIG. 4. When the difference in potentials between these terminals 22 and 24 increases, the beam 422 is deformed from a rest state (represented in FIG. 6) to an active state. In the rest state, the relay 420 is non-passing. In the active state, the relay 420 is passing. More specifically, when this difference in potentials exceeds a predetermined switching threshold, the relay 420 is in the passing state and the contacts 386 and 388 are in the closed state.

The operation of the harvester 380 in which the relay 384 is replaced by the relay 420 is identical to what has been previously described in the case of the relay 384.

In this embodiment, the control device is the beam 422 which transforms the difference in potentials between the terminals 22 and 24 into a mechanical displacement of the contacts 386 and 388 between the open and closed positions.

Figure 7:
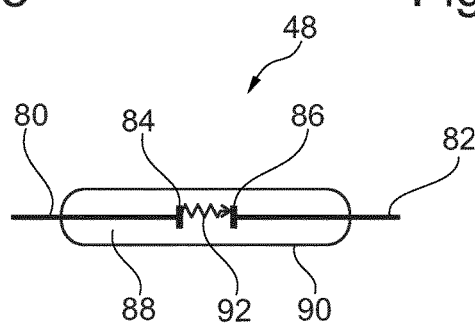
FIG. 7 is a schematic illustration of a spark gap or discharge tube.

FIG. 7 represents a possible embodiment of the switch 48 in more detail. Here, the switch 48 is a spark gap also called a "discharge tube". It comprises two electrical bump contacts 80 and 82 each electrically connected to an electrical contact, respectively, 84 and 86. The bump contacts 80, 82 are connected, respectively, to the terminal 40 and to the mid-point 178A. The contacts 84, 86 are fixed facing one another with no degree of freedom and separated mechanically and electrically from one another by an insulating medium 88. The insulating medium is, for example, a fluid such as a gas. For example, the medium 88 is hermetically enclosed in a sealed chamber 90. The contacts 84 and 86 are situated inside this chamber whereas the bump contacts 80 and 82 are situated outside this chamber.

The contacts 84, 86 and the medium 88 are arranged in such a way that an electrical arc 92 appears between the contacts 84 and 86 as soon as the excess of charges on the terminal 22 exceeds the threshold $S_1$. A person skilled in the art knows how to construct such an arrangement. In particular, the difference in potentials between the contacts 84, 86 from which the medium 88 is ionized and the electrical arc 92 appears is a function of the nature of the medium 88, of the distance between the contacts 84, 86 and of the form of these contacts. One of the important features of the medium 88 in this field is its dielectric strength.

When the electrical arc 92 appears, the electrical charges are transferred from the contact 84 to the contact 86 and therefore to the terminal 44. The presence of the electrical arc 92 corresponds to the closed position of the switch 48. Conversely, as long as the electrical arc 92 is absent, the contacts 84, 86 are electrically insulated from one another and the switch is in its open position.

In this embodiment, the control device 34 and the switch 48 are merged. They form just one and the same part.

Many other embodiments are possible. For example, the capacitor 3 can be replaced by a battery. The capacitor 3 can also be replaced by an electrical element that does not have the capacity to store electrical energy. For example, the capacitor 3 is replaced by a load consuming the electrical energy received. It can be a resistive load. In the latter case, the inductances 58 and 135 can be omitted.

[Variants of the Source of Energy to be Harvested]

The source of energy to be harvested can also be a mechanical displacement of a part such as a pushbutton. In this case, the first converter can comprise only the electromechanical transducer directly linked to this part so that the displacement of this part causes the mechanical stress that it exerts on this electromechanical transducer to vary.

When the source of energy to be harvested is a magnetic field source, the variable magnetic field generated by this source is not necessarily a magnetic field generated by a permanent magnet mounted to rotate on an axis. For example, what has been previously described applies also to the case when only the amplitude of one of the components $B_X$ or $B_Y$ varies over time. For example, such can be the case if the permanent magnet is mounted on a part which is only displaced in translation parallel to the direction X. The source of energy to be harvested which generates the variable magnetic field can also be a coil powered from time to time by a current or a simple electrical conductor which is passed through by a current, the intensity of which varies over time.

[Variants of the Converter]

Other possible embodiments of the converter 20 are described in the article A1 previously referred to or in the application US2004/0126620A1.

The electromechanical transducer of the converter 20 does not necessarily comprise a piezoelectric material. For example, as a variant, the electromechanical transducer is produced from a capacitor, the capacitance of which varies as a function of a mechanical displacement. Typically, the capacitor comprises two moving electrodes separated from one another by a dielectric material. When the electrodes are displaced, the capacitance of the capacitor varies. The displacement of the electrodes is actuated by:

a magnetostrictive material, to convert a magnetic field variation into a variation of electrical charges, or a thermomechanical transducer, to convert a temperature variation into a variation of electrical charges, or a mechanical displacement of a button to convert a mechanical displacement into a variation of electrical charges.

In a particular embodiment, the electrodes of the capacitor are produced in a magnetostrictive material. In this case, a variation of the amplitude of the magnetic field in a given direction results in a variation of the surface area of the electrodes and therefore of the capacitance of this capacitor.

In another variant, standard electrodes and a dielectric whose permittivity varies as a function of the magnetic field are chosen for the capacitor. The dielectric can, for example, be $BiFeO_3$. In this case also, a variation of the magnetic field results in a variation of the capacitance of the capacitor.

The variation of the capacitance of the capacitor is then transformed into a generation of electrical charges by an electronic device such as, for example, a device implementing electrets. The generation of electricity from a variation of capacitance and using electrets is, for example, described in the following article:

S. Boisseau, G. Despesse and A. Sylvestre, "*Optimization of an electret-based energy harvester*", Smart Material and Structures, 2010, 19 075015, IOP Publishing Ltd.

The magnetostrictive material of the converter 20 can also be a material with a negative magnetostriction coefficient. It can also be a material with an isotropic or anisotropic magnetostriction coefficient.

The converter 20 can comprise a number of assemblies of transducers connected in parallel between the connection terminals of this converter. For example, the converter 20 can comprise a second assembly identical to that described with reference to FIG. 3 but with a longitudinal direction that is angularly offset in the horizontal plane relative to the longitudinal direction of the first assembly.

In the case where the source of energy to be harvested is a temperature variation over time, possible embodiments of a converter to replace the converter 20 are described in the following article: D. Zakharov, G. Lebedev, O. Cugat, J. Delamare, B. Viala, T. Lafont, L. Gimeno and A. Shelyakov, "*Thermal energy conversion by coupled shape memory and piezoelectric effects*", PowerMEMS'11, Séoul, Corée, JMM 2012.

Other embodiments can also be found in the applications US 2011/0083714 or U.S. Pat. No. 7,397,169. The converter can also use a bimetallic strip such as a copper-aluminium bimetallic strip as thermomechanical transducer.

[Variants of Switches]

Other embodiments of the electrostatic relay 384 or of the piezoelectric relay 420 are possible. For example, other embodiments are described in the patent applications WO2004051687 or EP1093142.

Whatever the mechanical switch considered, the electrical contacts of this switch are not necessarily embodied by a protruding electrical bump contact. For example, the electrical contact can also be a region of the element which is deformed or is displaced and which comes to bear mechanically on the other electrical contact to establish the electrical continuity.

The invention claimed is:

1. An energy harvester suitable for transforming energy to be harvested into electrical energy, comprising:

a converter equipped with first and second connection terminals, the converter being suitable for converting a variation of the energy to be harvested into a corresponding excess of electrical charges on the first connection terminal relative to the second terminal, a collection circuit for collecting the excess of electrical charges on the first connection terminal, the collection circuit being equipped:

with an output terminal via which the collected charges are delivered, and with a controllable switch connected to the first connection terminal, this switch being suitable for switching between an open position in which it prevents the discharging of the electrical charges through the first connection terminal and a closed position in which it allows the discharging of the electrical charges through the first connection terminal, the open position being obtained by the mechanical separation of two electrical contacts and the interposition of an electrically insulating medium between the two electrical contacts, and a control device for the switch designed to control the switching of the switch to its closed position when the excess of electrical charges present on the first connection terminal exceeds a predetermined threshold, wherein the control device is electrically connected to the first terminal and suitable:

for exerting a force which stresses the electrical contacts towards one another, the force varying continually as a function of the quantity of electrical charges present on the first terminal and bringing the electrical contacts to bear on one another only when the excess of electrical charges exceeds the predetermined threshold, and/or for ionizing the electrically insulating medium to produce an electrical arc between the two electrical contacts only when the excess of electrical charges exceeds the predetermined threshold.

2. The energy harvester according to claim 1, in which the switch is a mechanical switch, the closed position in the mechanical switch being obtained by the bearing of one of the electrical contacts directly on the other electrical contact so as to establish an electrical continuity, and the control device comprises an electrostatic or piezoelectric transducer electrically connected to the first connection terminal of the converter, the transducer being suitable for transforming a part of the electrical charges present on the first connection terminal into a mechanical force which stresses the electrical contacts of the switch to the closed position, against a return force, the electrostatic or piezoelectric transducer being configured in such a way that the mechanical force becomes greater than the return force only when the excess of electrical charges present on the first connection terminal exceeds the predetermined threshold.

3. The energy harvester according to claim 2, in which the transducer is an electrostatic transducer comprising two actuation electrodes arranged facing one another and electrically insulated from one another by an electrically insulating medium, one of the electrodes being electrically connected to the first connection terminal of the converter to generate, as mechanical force, an electrostatic force between these two electrodes that is a function of the excess of electrical charges present on this first connection terminal.

4. The energy harvester according to claim 2, in which the transducer is a piezoelectric transducer comprising a suspended beam or membrane made of piezoelectric material electrically connected to the first connection terminal of the converter to generate, as mechanical force, a mechanical force that is a function of the excess of electrical charges present on this first connection terminal.

5. The energy harvester according to claim 1, in which first and second electrical contacts are fixed mechanically with no degree of freedom facing one another and mechanically separated from one another by the insulating medium, the first electrical contact being electrically connected to the first connection terminal, the electrical contacts and the insulating medium being arranged such that an electrical arc transfers a part of the excess of electrical charges from the first electrical contact to the other electrical contact when the excess of electrical charges present on the first connection terminal exceeds a predetermined threshold.

6. The energy harvester according to claim 1, in which the converter comprises:
  a first electromechanical transducer suitable for transforming a mechanical stress exerted on this electromechanical transducer into a generation of the excess of electrical charges collected by the collection electrical circuit, and
  a second transducer fixed with no degree of freedom to the first electromechanical transducer, this second transducer being suitable for converting a variation of the energy to be harvested into a mechanical stress exerted on the electromechanical transducer.

7. The energy harvester according to claim 6, in which the second transducer is a thermomechanical transducer suitable for transforming a temperature variation into a mechanical deformation of this second transducer.

8. The energy harvester according to claim 7, in which the thermomechanical transducer comprises a material with shape memory.

9. The energy harvester according to claim 6, in which the electromechanical transducer of the converter comprises a piezoelectric material.

* * * * *